(12) United States Patent
Khan et al.

(10) Patent No.: US 6,583,063 B1
(45) Date of Patent: *Jun. 24, 2003

(54) PLASMA ETCHING OF SILICON USING FLUORINATED GAS MIXTURES

(75) Inventors: Anisul Khan, Sunnyvale, CA (US); Dragan Podlesnik, Palo Alto, CA (US); Nam-Hun Kim, Cupertino, CA (US); Gene Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/263,634

(22) Filed: Mar. 5, 1999

Related U.S. Application Data

(63) Continuation-in-part of application No. 09/206,201, filed on Dec. 3, 1998, now Pat. No. 6,312,616.

(51) Int. Cl.[7] .............................................. H01L 21/302
(52) U.S. Cl. ........................ 438/706; 438/709; 438/711; 438/712; 438/719
(58) Field of Search ................................ 438/706, 707, 438/711, 714, 715, 719, 712, 709

(56) References Cited

U.S. PATENT DOCUMENTS

| | | | | |
|---|---|---|---|---|
| 4,666,555 A | | 5/1987 | Tsang | 156/643 |
| 4,726,879 A | | 2/1988 | Bondur et al. | 156/643 |
| 4,741,799 A | | 5/1988 | Chen et al. | 156/643 |
| 5,242,538 A | | 9/1993 | Hamrah et al. | 156/643 |
| 5,358,601 A | | 10/1994 | Cathey | 156/656 |
| 5,429,070 A | * | 7/1995 | Campbell et al. | 118/723 R |
| 5,433,823 A | | 7/1995 | Cain | 156/662.1 |
| 5,458,734 A | | 10/1995 | Tsukamoto | 156/643.1 |
| 5,486,706 A | * | 1/1996 | Yuki et al. | 257/25 |
| 5,643,473 A | * | 7/1997 | Tachi et al. | 216/67 |
| 5,658,472 A | | 8/1997 | Bartha et al. | 216/2 |
| 5,705,025 A | | 1/1998 | Dietrich et al. | 156/643.1 |
| 5,759,921 A | | 6/1998 | Rostoker | 438/711 |
| 5,767,021 A | * | 6/1998 | Imai et al. | 438/719 |
| 5,843,847 A | * | 12/1998 | Pu et al. | 438/723 |
| 5,854,136 A | | 12/1998 | Huang et al. | 438/714 |
| 5,880,033 A | * | 3/1999 | Tsai | 438/710 |
| 5,900,163 A | | 5/1999 | Yi et al. | 216/79 |
| 5,933,729 A | * | 8/1999 | Chan | 438/257 |
| 5,994,160 A | | 11/1999 | Niedermann et al. | 438/53 |
| 6,235,214 B1 | * | 5/2001 | Deshmukh et al. | 216/67 |
| 6,312,616 B1 | * | 11/2001 | Chinn et al. | 216/68 |

* cited by examiner

Primary Examiner—Benjamin L. Utech
Assistant Examiner—Binh X. Tran
(74) Attorney, Agent, or Firm—Moser, Patterson & Sheridan; Joseph Bach

(57) ABSTRACT

A method of etching silicon using a plasma generated from a gas comprising fluorine (F), oxygen (O), hydrogen (H) and carbon (C).

18 Claims, 3 Drawing Sheets

PLASMA ETCHING OF SILICON USING FLUORINATED GAS MIXTURES

CROSS-REFERENCE TO RELATED APPLICATIONS

This is a continuation-in-part of commonly-assigned U.S. patent application Ser. No. 09/206,201, entitled "Plasma Etching of Polysilicon Using Fluorinated Gas Mixtures", filed on Dec. 3, 1998, now U.S. Pat. No. 6,312,616 which is herein incorporated by reference. Additionally, this application contains subject matter that is related to commonly-assigned U.S. patent application Ser. No. 09/255,495, entitled "Plasma Etching of Silicon Using Fluorinated Gas Mixtures", filed on Feb. 23, 1999, now U.S. Pat. No. 6,235,214 incorporated herein by reference.

BACKGROUND OF THE DISCLOSURE

1. Field of the Invention

The invention relates to a method of plasma etching and, more particularly, to a method of etching silicon using gas mixtures comprising fluorine (F), oxygen (O), carbon (C), and hydrogen (H).

2. Description of the Background Art

Trenches formed in semiconductor substrates have many uses in producing integrated circuits including isolation, capacitor formation, transistor formation, and the like. One important use of trenches is in the formation of a trench capacitor as a storage node for a dynamic random access memory (DRAM) device. Trench capacitors are desirable because they occupy a relatively small area, while having large electrode surface area due to the depth of the trench used to form the capacitor. In a conventional trench capacitor, the trench walls form one electrode of the capacitor, the walls are coated with a thin dielectric material and then the remaining trench is filled with polysilicon such that the polysilicon forms the second electrode of the capacitor. As such, trench-based DRAM devices utilize less area than other forms of memory devices that use planar or stacked capacitors. To maximize the capacitance of the trench capacitor, the surface area of the trench walls is maximized, i.e., the trench is deep and the walls are substantially vertical.

Traditionally, storage nodes are formed using an anisotropic chemical or reactive ion etching of a masked silicon substrate. Etching chemistries utilize combinations of such chemicals as hydrogen bromide (HBr), chlorine ($Cl_2$), oxygen ($O_2$), nitrogen fluoride ($NF_3$), sulfur hexafluoride ($SF_6$), and nitrogen ($N_2$). For example, an HBr/$Cl_2$ chemistry can provide a silicon etch rate of about 5000 Å/min. with a photoresist selectivity (defined as the ratio of the etch rate of silicon to that of photoresist) of between 3:1 to 4:1. Other material layers such as oxide or nitride can also be used as an etch mask to improve the silicon to mask selectivity. To improve the throughput for wafer processing, it is desirable to maximize the silicon etch rate, especially for applications such as trench etching. In general, however, an increase in the silicon etch rate also decreases the mask etch selectivity.

Therefore, a need exists in the art for a silicon etching method that increases the silicon etch rate while enhancing mask selectivity.

SUMMARY OF THE INVENTION

The disadvantages associated with the prior art are overcome by the present invention of a method of silicon etching using a plasma generated from a gas (or gas mixture) comprising fluorine (F), oxygen (O), carbon (C) and hydrogen (H) elements. In one preferred embodiment, an etch gas (or mixture) comprising sulfur hexafluoride ($SF_6$), difluoromethane ($CH_2F_2$), and oxygen ($O_2$) is disclosed for trench etching in a silicon substrate at gas flow rates of about 65 sccm $SF_6$, 25 sccm $CH_2F_2$ and 60 sccm $O_2$, at a total pressure of about 15 mtorr and a substrate bias power of about 25 W. A silicon etch rate exceeding 1 $\mu$m/min. can be achieved with a hardmask etch selectivity greater than about 20:1. In particular, high aspect ratio silicon trenches with submicron dimensions have been etched at a rate of about 1.2–1.5 $\mu$m/min., with a hardmask selectivity as high as 28.

The invention can be practiced using, for example, a combination of about 10–100 sccm of a fluorinated gas (i.e., a gas comprising the fluorine element), 1–100 sccm of a fluoro-hydrocarbon gas (i.e., a gas comprising F, H, and C elements), and about 10–100 sccm of an oxygen-containing gas (i.e., a gas comprising the oxygen element), with a total pressure of about 4–100 mtorr. Alternatively, gas compositions comprising $SF_6$:$CH_2F_2$ and $O_2$:$CH_2F_2$ ratios of between 1.5:1 to 3:1 have been used for anisotropic etching of silicon, resulting in trenches with near-vertical profiles. A decoupled plasma source (DPS) etch reactor is used in one embodiment of the present invention. In general, an inductive source power of about 300–5000 W can be used for plasma generation, with a cathode bias power of about 10–500 W applied to a wafer support pedestal, which can be maintained within a temperature range of about −40 to 60 degrees Celsius.

The etch process of the present invention can also be adapted to etch other forms of silicon material layers, including polysilicon and amorphous silicon, along with the use of a photoresist mask in lieu of a hardmask.

BRIEF DESCRIPTION OF THE DRAWINGS

The teachings of the present invention can be readily, understood by considering the following detailed description in conjunction with the accompanying drawings, in which.

To facilitate understanding, identical reference numerals have been used, where possible, to designate identical elements that are common to the figures.

DETAILED DESCRIPTION

The present invention relates to a method of silicon etching using a plasma generated from a gas (or mixture) comprising fluorine (F), oxygen (O), carbon (C) and hydrogen (H) elements. The etch process of the present invention is reduced to practice in a Silicon Etch DPS (Decoupled Plasma Source) Centura® etch system and in a Deep Trench DPS system, both of which are available from Applied Materials, Inc. of Santa Clara, Calif. A detailed description of the Silicon Etch DPS system was disclosed by Yan Ye et al. at the Proceedings of the Eleventh Symposium of Plasma Processing, May 7, 1996, and is published in the Electrochemical Society Proceedings, Volume 96–12, pp. 222–233 (1996). This reference is herein incorporated by reference. The Deep Trench DPS sytem has a smaller chamber volume and a smaller spacing between an inductive coil and a wafer pedestal as compared to the Silicon Etch DPS system. It also incorporates a fixed frequency for the bias power applied to the wafer pedestal.

Figure 1:
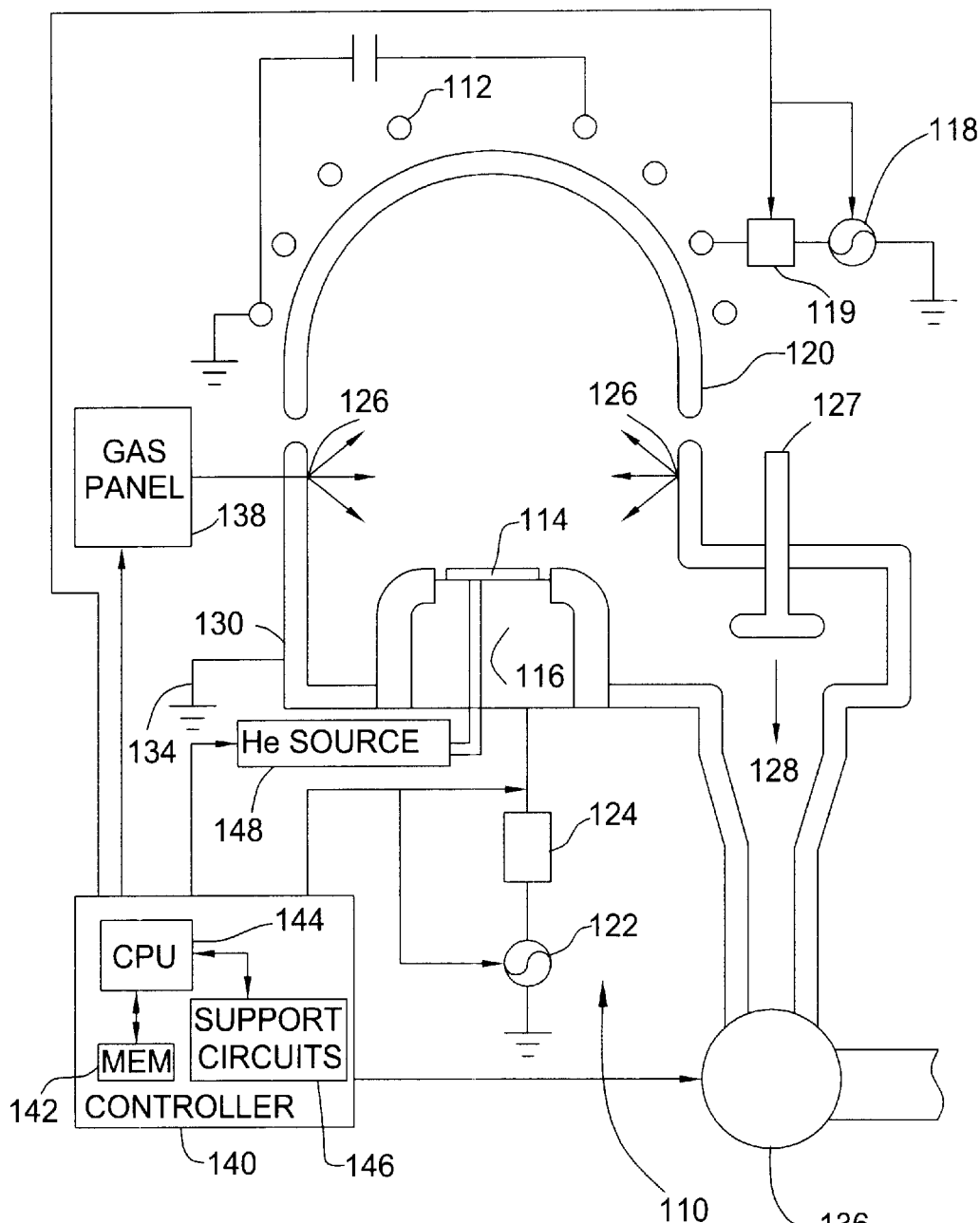
FIG. 1 depicts a schematic diagram of a plasma processing apparatus of the kind used in performing the etch processes of the present invention.

FIG. 1 depicts a simplified schematic diagram of a DPS etch processing chamber 110, which is constructed to include at least one inductive coil antenna segment 112, positioned exterior to a dielectric, dome-shaped ceiling 120 (referred to herein as the dome 120), and connected to a radio-frequency (RF) source 118 (which is generally capable of producing an RF signal having a tunable frequency of about 12.56 MHz). The RF source 118 is coupled to the antenna 112 through a matching network 119. Process chamber 110 also includes a substrate support pedestal (cathode) 116 which is connected to a second RF source 122. The RF source 122 is generally capable of producing a RF signal having a frequency in the range of 50 kHz to 15 MHz. In the case of the deep trench DPS chamber, a bias frequency of about 400 kHz is used. The source 122 is coupled to the cathode 116 through a matching network 124. The chamber 110 also contains a conductive chamber wall 130 that is connected to an electrical ground 134. A controller 140 comprising a central processing unit (CPU) 144, a memory 142, and support circuits 146 for the CPU is coupled to the various components of the DPS etch processing chamber 110 to facilitate control of the etch process.

In operation, the substrate 114 is placed on the substrate support pedestal/cathode 116 and gaseous components are supplied from a gas panel 138 to the process chamber 110 through entry ports 126. A plasma is ignited in the process chamber 110 by applying RF power from the RF sources 118 and 122 respectively to the antenna 112 and the pedestal/cathode 116. The pressure within the interior of the etch chamber 110 is controlled using a vacuum pump 136 and a throttle valve 127 situated between the chamber 110 and the vacuum pump 136. The temperature at the surface off the chamber walls 130 is controlled using liquid-containing conduits (not shown) which are located in the walls 130 of the chamber 110.

A closed-loop system (not shown) is used to circulate a heat transfer medium through the pedestal/cathode 116 for temperature control. By using an appropriate heat transfer medium, either heating or cooling of the pedestal/cathode 116 can be accomplished. A helium gas flow from source 148 to channels formed by the back of the substrate 114 and grooves (not shown) on the pedestal surface, is used to facilitate heat transfer between the substrate 114 and the pedestal/cathode 116. During the etch process, the substrate 114 is gradually heated by the plasma to a steady state temperature of approximately 30–130 degrees C. Using thermal control of both the dome 120 and the pedestal/cathode 116, the substrate 114 can be maintained at a temperature of about –20 to 60 degrees C. in a typical DPS chamber. To achieve this substrate temperature, the dome 120 is maintained at approximately 80 degrees C.—e.g., by lamp heating (not shown), and the chamber walls are maintained at approximately 65 degrees C., e.g., by a separate closed-loop control system (not shown).

The RF power applied to the inductive coil antenna 112 has a frequency between 50 kHz and 15 MHz, and preferably about 12.56 MHz, and may vary in power from a few hundred watts to several thousand watts. In one embodiment of the invention, as practiced in a Deep Trench DPS chamber for example, the antenna power has a frequency of 12.56 MHz and a power of between 300 and 2000 watts, while the bias power has a RF frequency of 400 kHz with a power of between 10 and 500 watts. In other etch chambers, a DC bias power may also be used with the etch process of the present invention.

To facilitate control of the chamber 110 as described above, the CPU 144 may be one of any form of general purpose computer processor that can be used in an industrial setting for controlling various chambers and subprocessors. The memory 142 is coupled to the CPU 144. The memory 142 may be one or more of readily available memory such as random access memory (RAM), read only memory (ROM), floppy disk, hard disk, or any other form of digital storage; and may be a part of a host computer at some remote location. The support circuits 146 are coupled to the CPU 144 for supporting the processor in a conventional manner. These circuits include cache, power supplies, clock circuits, input/output circuitry and subsystems, and the like. The control software that is used for implementing the etching process of the present invention is generally stored in memory 142 as a software routine. The software may also be stored and/or executed by a CPU that is remotely located from the hardware being controlled by the CPU.

When executed by the CPU 144, the software routine transforms the general purpose computer into a specific purpose computer (controller 140) that controls the chamber operation such that the etching process is performed. The specific process steps performed by the software routine are discussed in detail below with respect to FIGS. 2a and 2b below.

Although the process of the present invention is discussed as being implemented as a software routine, some of the method steps that are disclosed herein may be performed in hardware as well as by the software controller. As such, the invention may be implemented in software as executed upon a computer system, in hardware as an application specific integrated circuit or other type of hardware implementation, or a combination of software and hardware.

In the following discussion, trench etching in a silicon substrate (e.g., usually single crystal silicon wafer) within a DPS chamber is used to illustrate one embodiment of the present invention. The etch process, however, is generally applicable to other forms of silicon. Therefore, it should be emphasize that "silicon" is meant to include all forms of silicon material—e.g., single crystal silicon, polysilicon and amorphous silicon, without regard to how the silicon material layer is formed. Furthermore, the invention can be practiced in other chambers which may generate reactive plasmas in ways different from that in a DPS chamber, including for example, a capacitively coupled plasma system or a process chamber within a remote plasma generation system.

Figure 2A:
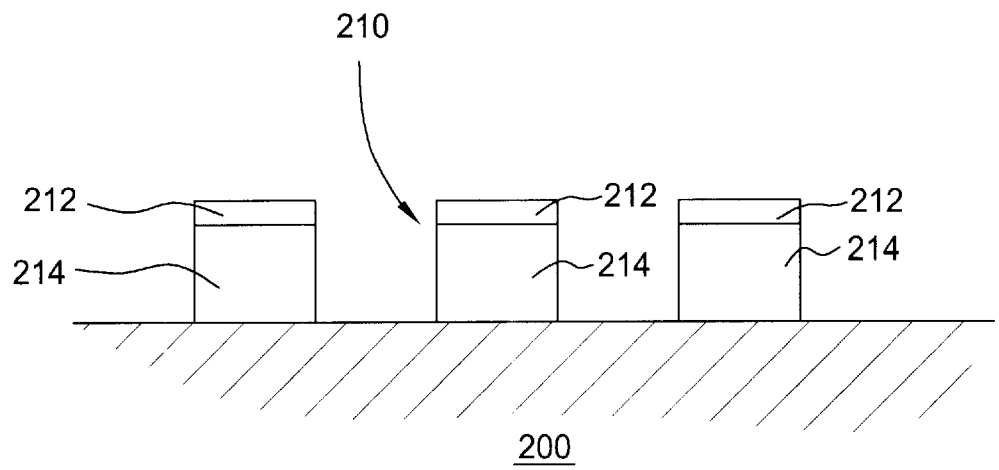
FIG. 2a depicts a schematic cross-sectional view of a substrate prior to being etched by the method of the present invention.

FIG. 2a depicts a cross-sectional profile of a pre-etch silicon (Si) substrate 200 with a patterned mask 210. The patterned mask 210 may either be a photoresist material or a "hardmask" material containing oxide, nitride, or metals, among others. In this embodiment, the patterned mask 210 is a hardmask which is made up of two material layers: a 600 Å, thick silicon oxynitride (SiON) layer 212 and an oxide layer 214 consisting of about 4300 Å of high temperature oxide (HTO). The multi-layer hardmask 210 can be formed by a combination of material processing steps such as deposition, lithography and etching that are well-known to those skilled in the art. The Si substrate 200 of FIG. 2a can be etched in a DPS chamber using the process parameters shown in Table 1.

TABLE 1

| SF$_6$ | 65 sccm |
|---|---|
| CH$_2$F$_2$ | 25 sccm |
| O$_2$ | 60 sccm |
| Pressure | 15 mtorr |
| Antenna Power | 700 W |
| Cathode Power | 25 W |
| Pedestal Temperature | 15 deg. C. |

Figure 2B:
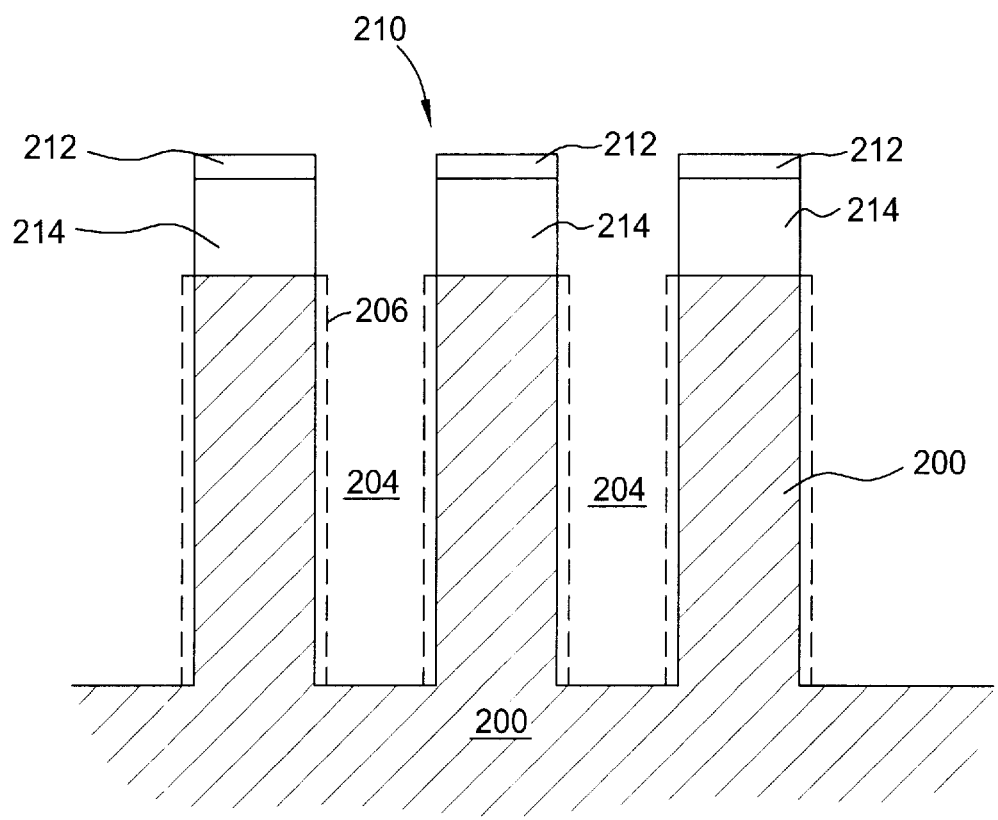
FIG. 2b depicts a schematic cross-sectional view of the substrate of FIG. 2a after being etched by the method of the present invention.

As shown in Table 1, a preferred embodiment of the present invention uses a gas mixture comprising sulfur hexafluoride (SF$_6$), difluoromethane (CH$_2$F$_2$), and oxygen (O$_2$) as the plasma source gas. In one embodiment, for example, the source gas is made up of about 43% SF$_6$, 17% CH$_2$F$_2$ and 40% O$_2$. This chemistry provides a Si etch rate in excess of about 12,000 Å/min. and a mask selectivity of greater than 20:1. Depending on the aspect ratio (defined generally as the ratio of depth:width) of the specific structure, a mask selectivity as high as about 28:1 can also be achieved. FIG. 2b illustrates a cross-sectional profile of Si trenches 204 formed in the Si substrate 200 after etching.

Although the etch process is preferably performed according to the parameters shown in Table 1, wider flow ranges corresponding to different gas compositions are also acceptable: e.g., 10–100 sccm of SF$_6$, 1–100 sccm of CH$_2$F$_2$, and 10–100 sccm of O$_2$ at a total chamber pressure of about 4–100 mtorr. The gases are supplied from the gas panel 138 and the pressure is set by the vacuum pump 136 and the valve 127. Both the chamber pressure and the gas flow rates are controlled by controller 140.

Figure 3A:
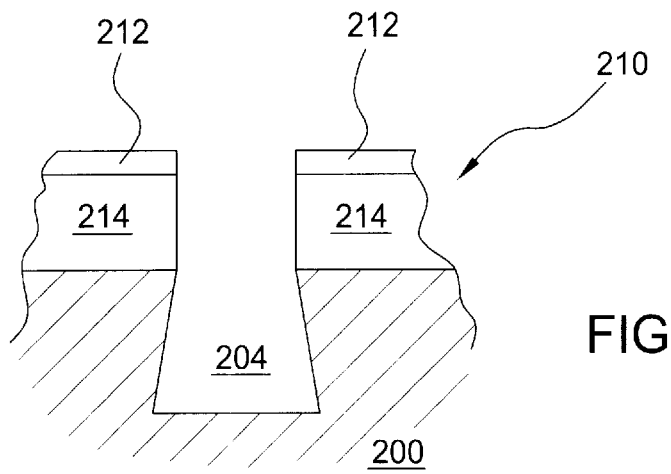
FIGS. 3a–3c depict schematic cross-sectional views of different trench profiles.
Figure 3B:
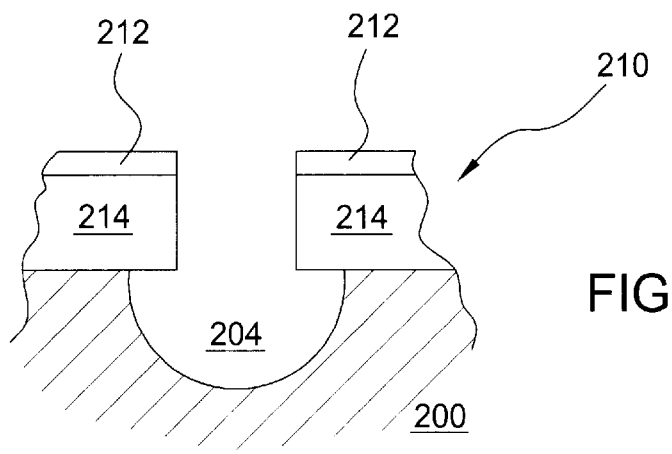
Figure 3C:
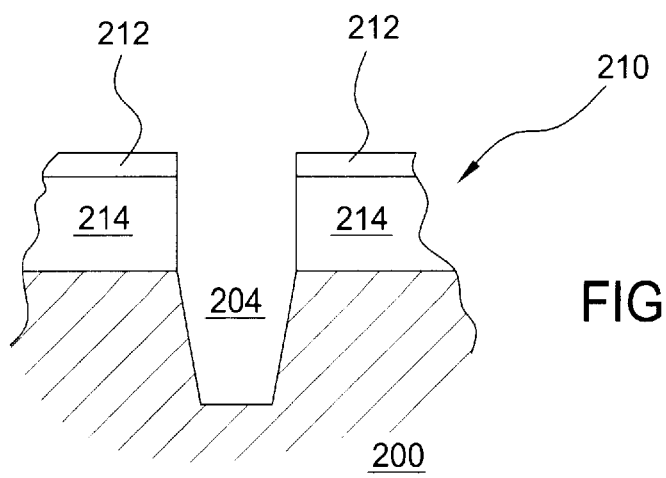

FIGS. 3a–3c depict various trench profiles that result for variations in the chemistry of the etchant gases. In the present invention, SF$_6$ acts as a source of etchant species— for example, atomic fluorine (F), and contributes to isotropic etching of Si. In general, a gas mixture with a high SF$_6$ content tends to result in an undercut etch profile. FIGS. 3a-3b depict trench profiles having an undercut. The presence of CH$_2$F$_2$ and O$_2$, however, allows profile and dimension control of the trench 204 by protecting the sidewall 206 against lateral etching. For example, a gas mixture with high CH$_2$F$_2$ and O$_2$ contents may lead to a tapered profile, as illustrated in FIG. 3c. At some combination of SF$_6$, CH$_2$F$_2$ and O$_2$ flow rates, a near-vertical profile such as that shown in FIG. 2b can be achieved. This may result, for example, when CH$_2$F$_2$ and O$_2$ either alone or in combination, interact with Si to form a thin polymer (shown in phantom) on the sidewall 206, which "passivates" the sidewall 206 against excessive lateral etching by etchant species. By adjusting the relative concentrations of components in the gas mixture, different degrees of passivation and etching can be achieved, thereby allowing profile and dimension control to be tailored as desired. Of course, other operating parameters such as pressure, powers and substrate temperature also affect trench profile and dimension, as well as the resulting silicon etch rate and mask selectivity.

It should be noted that "gas mixture" and "gas", as used in this discussion, are interchangeable, and either usage should be interpreted broadly to include situations corresponding to a single-component gas as well as a multi-component gas. For example, a gas comprising fluorine (F), oxygen (O) and carbon (C) includes either a single-component gas, or a multi-component gas mixture (e.g., SF$_6$, O$_2$ and CO$_2$) containing the elements F, O and C.

In general, the etch chemistry of the present invention encompasses a gas mixture comprising F, O, C and H. For example, fluorinated gases, including nitrogen fluoride (NF$_3$) and tetra-fluoromethane (CF$_4$) among others, can be used as a source of etchant species. Likewise, other fluorohydrocarbon gases (i.e., those containing at least F, H and C elements), including trifluoromethane (CHF$_3$) and fluoromethane (CH$_3$F) among others, can also be used to serve a similar role as CH$_2$F$_2$. These fluorinated gases, along with O$_2$ or others comprising the oxygen element (oxygen-containing gases), form a gas mixture whose compositions can be adjusted to provide effective profile and dimension control for silicon trench etching.

Although this discussion and Table 1 present the etch recipe in terms of gas flow rates in sccm, it is understood that these flow ranges are meant to be illustrative of certain specific embodiments. More generally, the invention encompasses varying gas composition ratios (either mole or volume ratios) to yield the desired profile and dimension for trench structures. For example, gas compositions comprising ratios of SF$_6$:CH$_2$F$_2$ at about 1.5:1, 2:1, 2.4:1 and 3:1; as well as compositions comprising ratios of O$_2$:CH$_2$F$_2$ at about 1.5:1, 2.2:1, 2.6:1 and 3:1; have been used for silicon etching, resulting in anisotropic trench profiles. In particular, composition ratios of both SF$_6$:CH$_2$F$_2$ and O$_2$:CH$_2$F$_2$ are preferably about 2.5:1.

In general, to practice the present invention, a reactive plasma can be generated by an inductive source power of about 300–5000 W at 12.56 MHz, preferably about 700 W. A cathode bias power of about 10–500 W, preferably about 25 W at 400 kHz, can be used for biasing the wafer substrate 114. The etch process can be performed within a substrate temperature range of about −40 to 60° C., and preferably about 15° C. Once the reactive gases are present in the chamber 110 at sufficient pressure, the controller 140 activates the power sources 118 and 122 as well as controls the matching networks 119 and 124 to achieve an efficient coupling of the RF power to the chamber 110. An operating pressure of about 4–100 mtorr can typically be used, although about 15 mtorr is preferred. Additionally, throughout the etch process, the controller 140 maintains a uniform wafer temperature by controlling the helium source as well as individual temperature controls of the pedestal/cathode 116, the chamber walls 130 and the dome 120.

Using the etch process of the present invention, anisotropic etching of high aspect ratio, silicon trenches: can be achieved at an etch rate exceeding about 1 μm/min. For example, a silicon etch rate of about 1.2–1.5 μm/min. can be achieved with a mask selectivity greater than about 20:1, and as high as about 28:1. A within-wafer etch uniformity as high as about ±3% has also been achieved. The within-wafer etch uniformity is defined as $(ER_{max}-ER_{min})/(2ER_{avg})$, where $ER_{max}$ is the maximum etch rate, $ER_{min}$ is the minimum etch rate, and $ER_{max}$ is the average etch rate observed within a wafer. In particular, for 0.34 μm features, Si trenches with an aspect ratio of about 21 can be etched at a rate of about 1.2 μm/min. and a mask selectivity of about 21. For 0.6 μm features, trenches with an aspect ratio of about 13 have been etched at a rate of about 1.4 μm/min. with a mask selectivity of about 27.

As previously mentioned, the process can also be applied to etching polysilicon or amorphous silicon layers. Likewise, the use of a multi-layer hard mask 210 is meant for illustrative purpose only, and the recipe can readily be adapted for use with other hardmasks or a photoresist mask. The Si etch rate and photoresist selectivity can be optimized by adjusting the composition of the reactant gas mixture as well as the operating pressure and powers. For example, photoresist selectivity can be improved by increasing the amount of $CH_2F_2$ in the gas mixture because $CH_2F_2$ contributes to the formation of a thin polymer layer, which protects the photoresist against attack by etchant species. In general, an increased $CH_2F_2$ composition results in a decrease in silicon or polysilicon etch rate, which may then be compensated for by adjusting the power or operating pressure in the chamber.

Although several preferred embodiments which incorporate the teachings of the present invention have been shown and described in detail, those skilled in the art can readily devise many other varied embodiments that still incorporate these teachings.

What is claimed is:

1. A method of silicon etching comprising the steps of:
    supplying a first gas comprising fluorine (F), a second gas comprising oxygen (O), and a third gas comprising carbon (C) and hydrogen (H) to a chamber wherein the second gas comprising oxygen (O) and the third gas comprising carbon (C) and hydrogen (H) are present in a ratio greater than about 1.5:1;
    igniting a plasma within said chamber; and
    etching a silicon material layer within said chamber.

2. The method of claim 1, wherein said first gas comprising fluorine (F) is selected from the group consisting of $SF_6$, $NF_3$, and $CF_4$.

3. The method of claim 1, wherein said second gas comprising oxygen (O) is selected from the group consisting of $O_2$ and $CO_2$.

4. The method of claim 1, wherein said third gas comprising carbon (C) and hydrogen (H) is selected from the group consisting of $CHF_3$, $CH_2F_2$, and $CH_3F$.

5. The method of claim 1 wherein the first gas comprises approximately 10 to 100 sccm of $SF_6$, the second gas comprises approximately 10 to 100 sccm of $O_2$, and the third gas comprises approximately 1 to 100 sccm of $CH_2F_2$.

6. The method of claim 1 wherein the first gas comprising fluorine (F) and the third gas comprising carbon (C) and hydrogen (H) are present in said chamber in a ratio greater than about 1.5:1.

7. The method of claim 1 wherein the third gas comprising carbon (C) and hydrogen (H) further comprises fluorine (F).

8. The method of claim 1 wherein said igniting step comprises the step of applying a bias power to a cathode electrode of about 10 to 500 watts.

9. The method of claim 1 wherein the igniting step comprises the step of applying an inductive source power to an inductively coupled antennae of about 300 to 5000 watts.

10. The method of claim 1 wherein the chamber pressure is between about 4 to 100 mtorr.

11. The method of claim 1 wherein the etching step further comprises the steps of:
    etching said silicon material layer at a rate exceeding about 10,000 Å/min; and
    etching a mask layer at a rate less than about 1/20 the etch rate of a said silicon material layer.

12. The method of claim 1 wherein, during the etching step, a pedestal that supports a workpiece containing said silicon material layer within said chamber is maintained at a temperature between about −40 and 60 degrees Celsius.

13. A method of etching comprising the steps of:
    supplying a gas mixture comprising $SF_6$, $O_2$, and $CH_2F_2$ to a chamber wherein the $O_2$ and the $CH_2F_2$ are present in a ratio greater than about 1.5:1;
    igniting a plasma within said chamber by applying a bias power to a cathode electrode of 10 to 500 watts and by applying an inductive source power to an inductively coupled antennae of 300 to 5000 watts; and
    etching a silicon material layer within said chamber.

14. The method of claim 13 wherein the gas comprises about 10 to 100 sccm of $SF_6$, about 10 to 100 sccm of $O_2$, and about 1 to 100 sccm of $CH_2F_2$.

15. The method of claim 13, wherein a gas pressure within said chamber is between about 4 to 100 mtorr.

16. The method of claim 13, wherein the etching step further comprises the steps of:
    etching said silicon material layer at a rate exceeding about 10,000 Å/min.; and
    etching a masking layer at a rate less than about 1/20 of the etch rate of said silicon material layer.

17. The method of claim 13 wherein, during the etching step, a pedestal that supports said silicon material layer within the chamber is maintained at a temperature between about −40 and 60 degrees Celsius.

18. The method of claim 13, wherein said gas comprises $SF_6$ and $CH_2F_2$ in a $SF_6$:$CH_2F_2$ ratio greater than about 1.5:1.

* * * * *